(12) United States Patent  
Sommer et al.

(10) Patent No.: US 7,381,116 B2
(45) Date of Patent: Jun. 3, 2008

(54) POLISHING MEDIA STABILIZER

(75) Inventors: Phillip R. Sommer, Newark, CA (US); Paul Butterfield, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 11/394,255

(22) Filed: Mar. 30, 2006

(65) Prior Publication Data

US 2006/0178095 A1    Aug. 10, 2006

Related U.S. Application Data

(63) Continuation of application No. 10/262,164, filed on Oct. 1, 2002, now Pat. No. 7,040,964, which is a continuation of application No. 09/258,036, filed on Feb. 25, 1999, now Pat. No. 6,491,570.

(51) Int. Cl.
*B24B 21/00* (2006.01)
(52) U.S. Cl. .................. 451/296; 451/388; 451/494; 451/287
(58) Field of Classification Search ............. 451/41, 451/285–290, 296, 388, 168, 491, 494, 921
See application file for complete search history.

(56) References Cited

U.S. PATENT DOCUMENTS

| | | | |
|---|---|---|---|
| 1,353,967 A | 9/1920 | Lorenz | |
| 2,646,654 A | 7/1953 | Brink | |
| 3,376,578 A | 4/1968 | Sawyer | |
| 4,347,689 A | 9/1982 | Hammond | |
| 4,373,991 A | 2/1983 | Banks | |
| 4,521,995 A | 6/1985 | Sekiya | |
| 4,571,799 A | 2/1986 | Chitayat | |
| 4,603,867 A | 8/1986 | Babb et al. | |
| 4,642,943 A | 2/1987 | Taylor, Jr. | |
| 4,910,155 A | 3/1990 | Cote et al. | |
| 4,918,870 A | 4/1990 | Torbert et al. | |
| 5,036,630 A | 8/1991 | Kaanta et al. | |
| 5,065,547 A | 11/1991 | Shimizu et al. | |
| 5,076,024 A | 12/1991 | Akagawa et al. | |

(Continued)

FOREIGN PATENT DOCUMENTS

DE    1037308    1/1957

(Continued)

OTHER PUBLICATIONS

Butterfield, et al., "Platen With Web Release Apparatus", U.S. Appl. No. 09/676,395, filed Sep. 29, 2000.

(Continued)

*Primary Examiner*—Dung Van Nguyen
(74) *Attorney, Agent, or Firm*—Patterson & Sheridan

(57) ABSTRACT

A polishing apparatus that employs a polishing media retention arrangement to prevent slippage or wrinkles in the polishing media during polishing. The polishing media is drawn against a support surface by a vacuum applied between the polishing media and the support surface. Also, a porous layer may be placed between the polishing media and the support surface to form dimples in the polishing media upon the application of vacuum. An alternative arrangement draws the polishing media against a carrier and the substrate to be polished.

20 Claims, 13 Drawing Sheets

U.S. PATENT DOCUMENTS

| | | | |
|---|---|---|---|
| 5,081,795 A | 1/1992 | Tanaka et al. |
| 5,088,240 A | 2/1992 | Ruble et al. |
| 5,099,615 A | 3/1992 | Ruble et al. |
| 5,197,999 A | 3/1993 | Thomas |
| 5,209,027 A | 5/1993 | Ishida et al. |
| 5,212,910 A | 5/1993 | Breivogel et al. |
| 5,216,843 A | 6/1993 | Breivogel et al. |
| 5,232,875 A | 8/1993 | Tuttle et al. |
| 5,234,867 A | 8/1993 | Schultz et al. |
| 5,276,999 A | 1/1994 | Bando |
| 5,299,393 A | 4/1994 | Chandler et al. |
| 5,329,732 A | 7/1994 | Karlsrud et al. |
| 5,335,453 A | 8/1994 | Baldy et al. |
| 5,377,451 A | 1/1995 | Leoni et al. |
| 5,384,986 A | 1/1995 | Hirose et al. |
| 5,398,459 A | 3/1995 | Okumura et al. |
| 5,399,125 A | 3/1995 | Dozier |
| 5,423,716 A | 6/1995 | Strasbaugh |
| 5,476,413 A | 12/1995 | Hasegawa et al. |
| 5,486,129 A | 1/1996 | Sandhu et al. |
| 5,487,697 A | 1/1996 | Jensen |
| 5,490,808 A | 2/1996 | Jantschek et al. |
| 5,498,196 A | 3/1996 | Karlsrud et al. |
| 5,498,199 A | 3/1996 | Karlsrud et al. |
| 5,516,400 A | 5/1996 | Pasch et al. |
| 5,522,965 A | 6/1996 | Chisholm et al. |
| 5,527,209 A | 6/1996 | Volodarsky et al. |
| 5,527,424 A | 6/1996 | Mullins |
| 5,529,638 A | 6/1996 | Lutz |
| 5,531,861 A | 7/1996 | Yu et al. |
| 5,533,923 A | 7/1996 | Shamouilian et al. |
| 5,536,202 A | 7/1996 | Appel et al. |
| 5,542,874 A | 8/1996 | Chikaki |
| 5,547,417 A | 8/1996 | Breivogel et al. |
| 5,548,505 A | 8/1996 | Simmons |
| 5,549,511 A | 8/1996 | Cronin et al. |
| 5,554,064 A | 9/1996 | Breivogel et al. |
| 5,554,065 A | 9/1996 | Clover |
| 5,558,563 A | 9/1996 | Cote et al. |
| 5,558,568 A | 9/1996 | Talieh et al. |
| 5,562,524 A | 10/1996 | Gill, Jr. |
| 5,562,529 A | 10/1996 | Kishii et al. |
| 5,564,965 A | 10/1996 | Tanaka et al. |
| 5,569,062 A | 10/1996 | Karlsrud |
| 5,575,706 A | 11/1996 | Tsai et al. |
| 5,578,529 A | 11/1996 | Mullins |
| 5,582,534 A | 12/1996 | Shendon et al. |
| 5,593,344 A | 1/1997 | Weldon et al. |
| 5,593,537 A | 1/1997 | Cote et al. |
| 5,595,529 A | 1/1997 | Cesna et al. |
| 5,597,346 A | 1/1997 | Hempel, Jr. |
| 5,599,423 A | 2/1997 | Parker et al. |
| 5,605,499 A | 2/1997 | Sugiyama et al. |
| 5,611,943 A | 3/1997 | Cadien et al. |
| 5,624,299 A | 4/1997 | Shendon |
| 5,635,083 A | 6/1997 | Breivogel et al. |
| 5,643,044 A | 7/1997 | Lund |
| 5,643,053 A | 7/1997 | Shendon |
| 5,643,056 A | 7/1997 | Hirose et al. |
| 5,643,067 A | 7/1997 | Katsuoka et al. |
| 5,645,471 A | 7/1997 | Strecker |
| 5,660,581 A | 8/1997 | Shin et al. |
| 5,676,590 A | 10/1997 | Hiraoka |
| 5,679,064 A | 10/1997 | Nishi et al. |
| 5,692,947 A | 12/1997 | Talieh et al. |
| 5,704,827 A | 1/1998 | Nishi et al. |
| 5,718,620 A | 2/1998 | Tanaka et al. |
| 5,722,877 A | 3/1998 | Meyer et al. |
| 5,738,574 A | 4/1998 | Tolles et al. |
| 5,759,918 A | 6/1998 | Hoshizaki et al. |
| 5,762,536 A | 6/1998 | Pant et al. |
| 5,791,969 A | 8/1998 | Lund |
| 5,792,709 A | 8/1998 | Robinson et al. |
| 5,795,218 A | 8/1998 | Doan et al. |
| 5,800,248 A | 9/1998 | Pant et al. |
| 5,851,136 A | 12/1998 | Lee |
| 5,853,317 A | 12/1998 | Yamamoto |
| 5,871,390 A | 2/1999 | Pant et al. |
| 5,873,769 A | 2/1999 | Chiou et al. |
| 5,897,424 A | 4/1999 | Evans et al. |
| 5,897,426 A | 4/1999 | Somekh |
| 5,899,801 A | 5/1999 | Tolles et al. |
| 5,906,532 A | 5/1999 | Nakajima et al. |
| 5,916,012 A | 6/1999 | Pant et al. |
| 5,921,852 A | 7/1999 | Kimura et al. |
| 5,954,912 A | 9/1999 | Moore |
| 5,997,384 A | 12/1999 | Blalock |
| 6,022,807 A | 2/2000 | Lindsey, Jr. et al. |
| 6,033,293 A | 3/2000 | Cravasse et al. |
| 6,068,542 A | 5/2000 | Hosokai |
| 6,102,777 A | 8/2000 | Duescher |
| 6,149,506 A | 11/2000 | Duescher |
| 6,207,572 B1 | 3/2001 | Talieh |
| 6,220,942 B1 | 4/2001 | Tolles et al. |
| 6,244,935 B1 | 6/2001 | Birang et al. |
| 6,312,319 B1 * | 11/2001 | Donohue et al. ............. 451/56 |
| 6,491,570 B1 | 12/2002 | Sommer et al. |
| 6,503,131 B1 | 1/2003 | Franklin et al. |
| 6,561,884 B1 | 5/2003 | White et al. |
| 6,592,439 B1 | 7/2003 | Li et al. |
| 6,602,380 B1 * | 8/2003 | Doan et al. ............... 156/345.1 |
| 7,040,964 B2 * | 5/2006 | Sommer et al. ............. 451/41 |

FOREIGN PATENT DOCUMENTS

| | | |
|---|---|---|
| EP | 0517594 A1 | 12/1992 |
| EP | 0653270 | 5/1995 |
| EP | 0696495 A1 | 2/1996 |
| EP | 0756917 | 2/1997 |
| EP | 0 770 455 A1 | 5/1997 |
| EP | 0 774 323 A2 | 5/1997 |
| EP | 0 774 323 A3 | 5/1997 |
| EP | 0818272 | 1/1998 |
| EP | 818272 A1 * | 1/1998 |
| JP | 59037051 | 2/1984 |
| JP | 60-228070 | 11/1985 |
| JP | 62-162466 | 7/1987 |
| JP | 2-269553 | 11/1990 |
| JP | 04-053682 | 2/1992 |
| JP | 4-250967 | 9/1992 |
| JP | 7-111256 | 4/1995 |
| JP | 9-225821 | 2/1997 |
| JP | 09029634 | 2/1997 |
| JP | 9248753 | 9/1997 |
| WO | 93/02837 | 2/1993 |
| WO | WO 9845090 A1 * | 10/1998 |

OTHER PUBLICATIONS

Search Report for EPO Application No. 00301458.6, dated Apr. 9, 2002.

* cited by examiner

POLISHING MEDIA STABILIZER

CROSS-REFERENCE TO RELATED APPLICATIONS

This application is a continuation of co-pending U.S. patent application Ser. No. 10/262,164, filed Oct. 1, 2002 now U.S. Pat. No. 7,040,964, which application is a continuation of U.S. patent application Ser. No. 09/258,036, filed Feb. 25, 1999, now U.S. Pat. No. 6,491,570, which applications are incorporated herein by reference.

BACKGROUND OF THE INVENTION

1. Field of the Invention

The present invention relates to the field of polishing, and especially to chemical mechanical polishing. More specifically the present invention is directed to improvements in retention of the polishing surface and retention of polishing fluids during polishing.

2. Background of the Related Art

Polishing a workpiece to produce a mirror-like, defect-free surface has applications in many fields of endeavor. Such polishing processes have become extremely important and widespread, for example, in the fabrication of semiconductor devices. The critical step of polishing a semiconductive wafer or substrate is required at a number of different stages along the varied processes employed to fabricate semiconductor devices.

Chemical mechanical polishing is rapidly becoming a technique of choice for polishing substrates, and particularly for use in the manufacture semiconductor devices on a wafer or substrate. The devices are connected by a process generally referred to as metalization, in which connecting lines of metal, often aluminum or copper, are applied by vacuum deposition or other suitable processes.

The performance level of semiconductor devices employing a conventional single metal layer connecting the devices is fast becoming unsuitable. Modern, high performance devices utilize multilevel metal interconnections. Multilevel connections may be constructed by depositing a dielectric or insulating layer over a first metal layer, etching via holes throughout the dielectric layer, and then depositing a second metal layer which fill the via holes to connect with the first metal layer. These devices offer higher device density and shortened interconnection lengths between the devices.

Since each of these metal and dielectric layers have an appreciable thickness, the wafer substrate is left with a non-planar topography as the various layers are patterned on top of one another. This type of non-planarity is often unacceptable in high density devices because the depth of field of the lithographic equipment that is used to print the smaller line width circuits on the wafer does not have a depth of focus sufficient to compensate for even small variations in wafer planarity.

In addition to the non-planarity caused by the fabricated device patterns, in-process wafer polishing, or planarization, must account for variations in overall wafer flatness as well. During the fabrication process, for example, the wafers may become bowed or warped.

In process polishing equipment, therefore, requires the specialized ability to achieve global, uniformly planar wafer surfaces in spite of these topographical wafer defects and variations. Chemical-mechanical polishing has gained wide acceptance as an effective means of achieving the global wafer surface planarity required by advanced devices employing multilayer metalization.

A typical chemical-mechanical polishing arrangement includes a wafer carrier having a generally circular pressure plate or carrier platen that supports a single substrate or wafer. A carrier film may be interposed between the carrier platen and the wafer. The wafer carrier is equipped with means to provide a downward force, urging the wafer against a polishing media (typically a circular pad), onto which is fed a polishing fluid. The polishing media is supported by a polishing platen. The polishing fluid may comprise a colloidal suspension of an abrasive and may also comprise a chemically reactive solution. A containment ring generally surrounds the wafer to prevent it from slipping off the carrier platen during polishing.

Typically, movement of the wafer relative to the pad, in the presence of the chemically reactive and/or abrasive polishing fluid and under pressure imparted by the wafer carrier, imparts a combination of chemical and mechanical forces to the wafer, the net effect of which is global planarization of the wafer surface. Generally, the polishing platen is rotatable as is the carrier platen. In a typical polishing apparatus, movement of the wafer relative to the pad is accomplished by rotating the polishing platen, the carrier platen, or both.

Rotating platen machines typically install a circular polishing pad and use it until the pad fails to obtain acceptable results because the pad becomes worn or becomes glazed with impacted polishing fluid and polishing particulate. At that time it is required to interrupt the polishing process and change the polishing pad. Other machines may use a rectangular pad or a continuous supply of polishing pad material that may be incrementally advanced over the polishing platen, to ensure that the polishing pad is never too worn to be effective.

Regardless of the configuration of the polishing pad, a common problem that occurs when the pad is not fixed to the polishing platen with an adhesive or other fixing means, is that the polishing pad migrates from its position when polishing forces are applied to it by the wafer carrier through the wafer. This migration results because the frictional forces between the wafer and the polishing pad, together with any chemical polishing media that might be employed, are greater that the frictional forces that exist between the polishing pad and the polishing platen. Such migration reduces the productivity and that accuracy of the polishing process requiring at least a reduction in the polishing pressure used in the process, thereby increasing the polishing time. Worse, the polishing pad may buckle during migration, resulting in nonplanar polishing results or total failure of the process (e.g. breakage of the substrate). These problems are not solely limited to chemical mechanical polishing but may also occur in purely mechanical polishing processes.

A problem that occurs particularly in chemical mechanical polishing machines is depletion of the chemical fluid or slurry between the substrate to be polished, and the polishing pad after a certain amount of polishing motion has occurred. Because of the relatively smooth and planar surfaces that comprise the polishing pad/platen and the substrate surface being polished, the polishing action tends to "sweep out" the chemical fluid/slurry and a vacuum or suction builds up between the substrate surface being polished and the polishing pad. Thus, this problem gets progressively worse with polishing time. Ironically, the problem also magnifies as the surface of the substrate becomes more planar and smooth, although the problem reduces the polishing efficiency and performance of the process.

It would be desirable to have an apparatus with the capability to prevent migration of the polishing pad, while at the same time allowing easy and quick replacement either continuously or intermittently. It would also be desirable to prevent the elimination of the chemical polishing agent, e.g., the phenomena known as "slurry starvation" between the substrate surface to be polished and the polishing pad.

DISCLOSURE OF THE INVENTION

The present invention addresses the above problems, among other advantages to be further developed in the following detailed description. An apparatus for stabilizing a polishing surface includes a substantially planar inflexible support base, a flexible polishing pad overlying the support base, and a vacuum port in the support base and underlying the polishing pad. When vacuum is applied through the vacuum port, the polishing pad is pulled against the support base to maintain the polishing pad in a predetermined polishing position. A seal is preferably provided to form a perimeter around the vacuum port on the support base. An airtight seal is formed between the support base and the polishing pad along the seal upon application of the vacuum.

Another embodiment employs a plurality of vacuum ports to more evenly distribute the application of vacuum. For example, the plurality of vacuum ports may lie around a perimeter of the support base. Alternatively, the plurality of vacuum ports may be substantially equally distributed over the support base. The plurality of vacuum ports may include a group of relatively larger vacuum ports around a perimeter of the support base and a group of relatively smaller vacuum ports substantially equally distributed over an area of the support base within the perimeter.

The present invention further includes the placement of an additional layer between the polishing pad or media and the support base. The additional layer is provided so that, when the polishing pad is drawn against the support base by application of vacuum, nonplanarities are formed in the polishing pad. These nonplanarities help retain polishing fluid in the polishing area of the polishing pad during polishing of a substrate.

The additional layer is preferably a resilient pad. The additional layer is perforated so that portions of the polishing pad are partially drawn into the perforations upon the application of vacuum. Preferably, the perforations have a diameter or size in the range of about 0.06 to about 0.25 inches.

As a means for fixing a polishing pad during polishing, a polishing apparatus according to the present invention includes a substantially planar inflexible support base, a flexible polishing pad overlying the support base, and means for drawing the polishing pad against the support base to maintain the polishing pad in a predetermined polishing position. Preferably, the drawing means comprise a vacuum source connected to at least one vacuum port in the support base, but other arrangements such as a source to draw the polishing pad to the head may be alternatively used as discussed below. Further, a substrate carrier is movably mounted with respect to the polishing pad and the support base.

A pad may be interposed between the flexible polishing pad and the support base. Preferably, the pad is perforated or porous. More preferably, the pad is a perforated resilient pad.

Also disclosed is a method of stabilizing a polishing media during polishing of a substrate against the polishing media. The method includes providing a polishing media over a substantially inflexible support surface, and applying a vacuum between the support surface and the polishing media to draw the polishing media toward the support surface. The vacuum is applied with a force of about 0.2 to 3.0 psi, preferably about 1.2 psi.

The method preferably further includes polishing a substrate against the polishing media while maintaining the vacuum to deter movement of the polishing media with respect to the support surface. Still further, the method may include removing the substrate from contact with the polishing media, discontinuing application of the vacuum and removal of the polishing media for cleaning, conditioning or replacement.

The method may include replacing the same polishing media after cleaning and/or conditioning it. After replacing the same polishing media, the vacuum is reapplied between the support surface and the polishing media to draw the polishing media toward the support surface. Alternatively, another polishing media may be positioned on the support surface to replace the original polishing media. Once the new polishing media is positioned, the vacuum is then reapplied between it and the support surface to draw it toward the support surface.

Optionally, a porous layer may be provided between the polishing media and the substantially inflexible support surface prior to applying the vacuum. Then, upon application of the vacuum, portions of the polishing media are partially drawn into porosities of the porous layer to form dimples on a polishing surface of the polishing media.

An apparatus for stabilizing a polishing surface is disclosed to include a substantially inflexible support base; a flexible polishing pad overlying at least a portion of the support base; and a carrier for applying a substrate against the polishing-pad to polish the substrate. Means for maintaining the flexible polishing pad substantially wrinkle free with respect to the substrate may include a vacuum port in the support base and underlying the polishing pad, or a mechanism for drawing the flexible polishing pad against the carrier and the substrate, for example.

When at least one vacuum port is provided in the support base, application of vacuum therethrough pulls the polishing pad against the support base to maintain the polishing pad in a predetermined polishing position. When the means for maintaining includes a mechanism for drawing the flexible polishing pad against the carrier and the substrate, at least one vacuum port may be formed in the carrier. A vacuum source is provided for applying a vacuum between the carrier and the polishing pad via the at least one vacuum port, thereby maintaining the polishing pad substantially wrinkle-free, at least in the portion underlying the carrier and substrate at any given time.

BEST MODE FOR CARRYING OUT THE INVENTION

Figure 1:
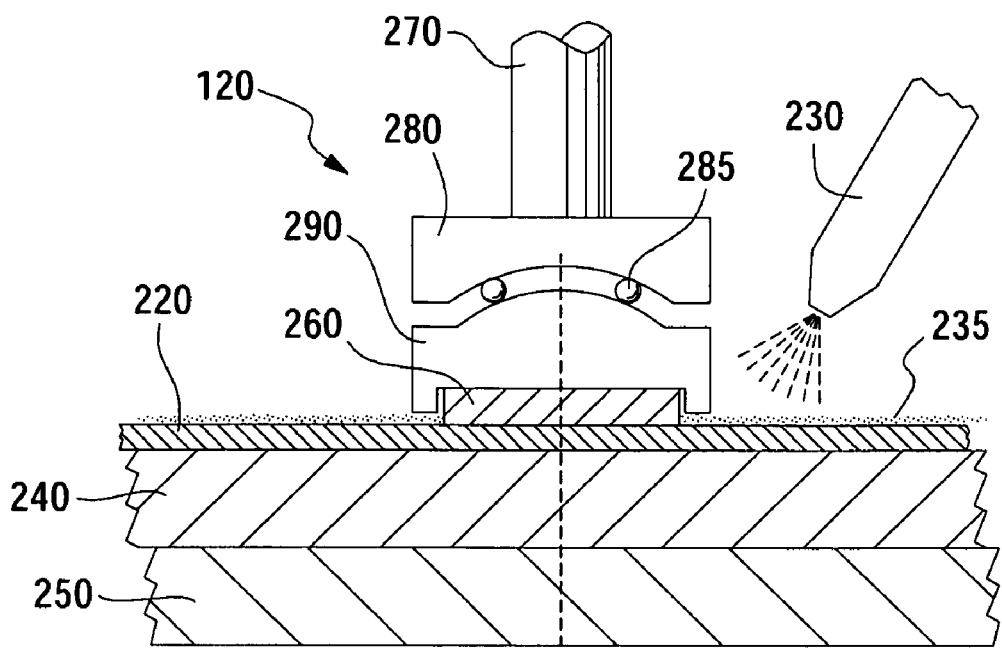
FIG. 1 is a partial cross-sectional view of an example of a polishing apparatus and the basic components thereof.

Referring to the drawings in detail wherein like numerals indicate like elements, the present invention generally involves improvements to the polishing pad of a polishing apparatus. To better understand the invention outlined below, it is useful to understand the basic components of the polishing apparatus.

Referring to FIG. 1, a substrate carrier 120 is generally positioned over a support base 250 which typically supports a polishing pad or strip 220. Substrate carrier 120 is generally capable of supporting a wafer or substrate while supplying the required force to facilitate polishing. Substrate carrier 120 may have some ability to self align the substrate 260 to the plane of support base 250. Optionally, a resilient pad 240 may be interposed between the polishing pad or polishing media 220 and the support base 250 for improved polishing in certain circumstances. The substrate carrier 120 may have a spindle 270 to which the required downward force and rotational forces are applied. As mentioned above, the substrate carrier 120 is preferably capable of self alignment so as to align the substrate 260 to the polishing media 220. Although there are many other possibilities, the substrate carrier 120 may allow for the rotation of the lower member 290 relative to the upper member 280 about a bearing means 285. Polishing fluid may be applied in metered fashion to the polishing media 220 by way of polishing fluid nozzle 230.

Various relative motions may be applied between the substrate 260 and the polishing media 220 to effectuate a polishing action. For example, one type of relative motion is achieved by maintaining the support base 250 non-movable with respect to ground and controllably moving the substrate carrier 120. The substrate carrier may be controlled by a motion controller (not shown) which is capable of controlled, or programmed movement along directions which are parallel to the plane of the support surface 250. Alternatively or additionally, the substrate carrier may be rotated about the axis defined by the spindle 270. Movement in each of the directions may be, and typically is, programmed to occur simultaneously.

Figure 2:
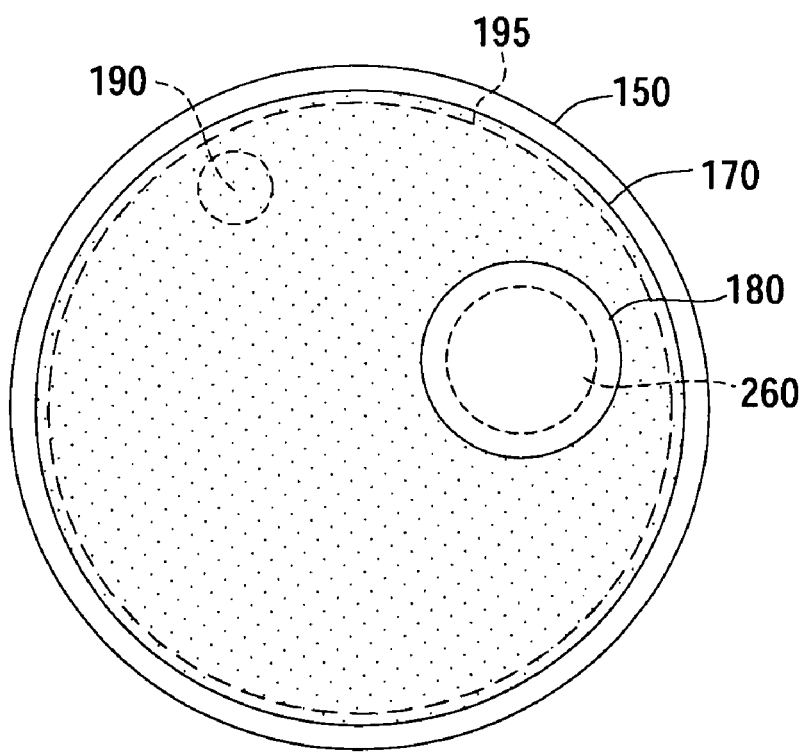
FIG. 2 is a top view of a first example of the present invention which employs a circular support base.

FIG. 2 shows a top view of a first example of the present invention which employs a circular support base 150. A flexible polishing pad 170 overlies the circular support base 150. An optional resilient pad (not shown), similar to the resilient pad 240 discussed above, may be employed between the flexible polishing pad 170 and the support base 150. The circular support base 150 may be rotatable so as to effectuate polishing forces against a substrate 260 when the substrate is held against the polishing pad 170 by means of a substrate carrier 180. Alternatively, the support base 150 may be held stationary while the carrier 180 is moved to effectuate the polishing action between the substrate 260 and the polishing pad 170. The substrate carrier 180 is preferably programmable so as to move linearly, rotationally, or according to a combination of both type movements with respect to the support base 150 and polishing pad 170.

Accordingly, there is effectively no limit to the patterns of polishing which can be accomplished by the carrier 180 with respect to the support base 150 and polishing pad 170. Another alternative operation of the apparatus shown in FIG. 1 is the simultaneous movement of both the carrier 180 and the support base 150 with respect to one another. This would generally involve the rotation of the support base 150 while the carrier 180 is also moved rotationally, linearly, or a combination of both types of movement.

Many conventional polishing apparatuses that have a rotating support base also fix the polishing pad to the support base with an adhesive. Such an arrangement is unwieldy when it comes time to change the polishing pad due to wear or caking. Removal of the polishing pad is not easily accomplished and portions of the pad and or adhesive may remain and require additional attention to ensure that the support base remains very planar when the new polishing pad is attached. Thus, this can be a very tedious and time consuming process that hinders production by causing down time.

However, as mentioned above, a common problem that occurs when the pad is not fixed to the polishing platen with an adhesive or other fixing means, is that the polishing pad migrates from its position when polishing forces are applied to it by the substrate carrier through the substrate. The migration results because the frictional forces between the substrate and the polishing pad, together with any chemical polishing media that might be employed, are greater that the frictional forces that exist between the polishing pad and the support base (polishing platen).

The arrangement in FIG. 2 overcomes the problems incurred with an adhesively applied polishing pad, as well as the problems mentioned with regard to a pad that is not adhesively fixed. A vacuum port 190 is formed in the support base 150 and connected to a vacuum source (not shown in FIG. 2). For support bases 150 that rotate, the vacuum source may interface with the vacuum port via slip rings or other equivalent arrangements known in the art. A sealing barrier 195, preferably a sealing ring such as a strip of IC1000 material (supplied by RODEL), an O-ring or some other material forming an effective vacuum seal, surrounds the vacuum port and follows a contour that is just inside the perimeter of the polishing pad 170. Thus, after positioning the polishing pad 170 on the support base 150, a vacuum can be drawn through the vacuum port 190 which forms an effective air seal along the sealing barrier 195. Once the air seal is formed, essentially any air existing between the polishing pad 170 and support base 150 is removed by the vacuum source thereby effectively fixing the polishing pad 170 to the support base 150.

Figure 3:
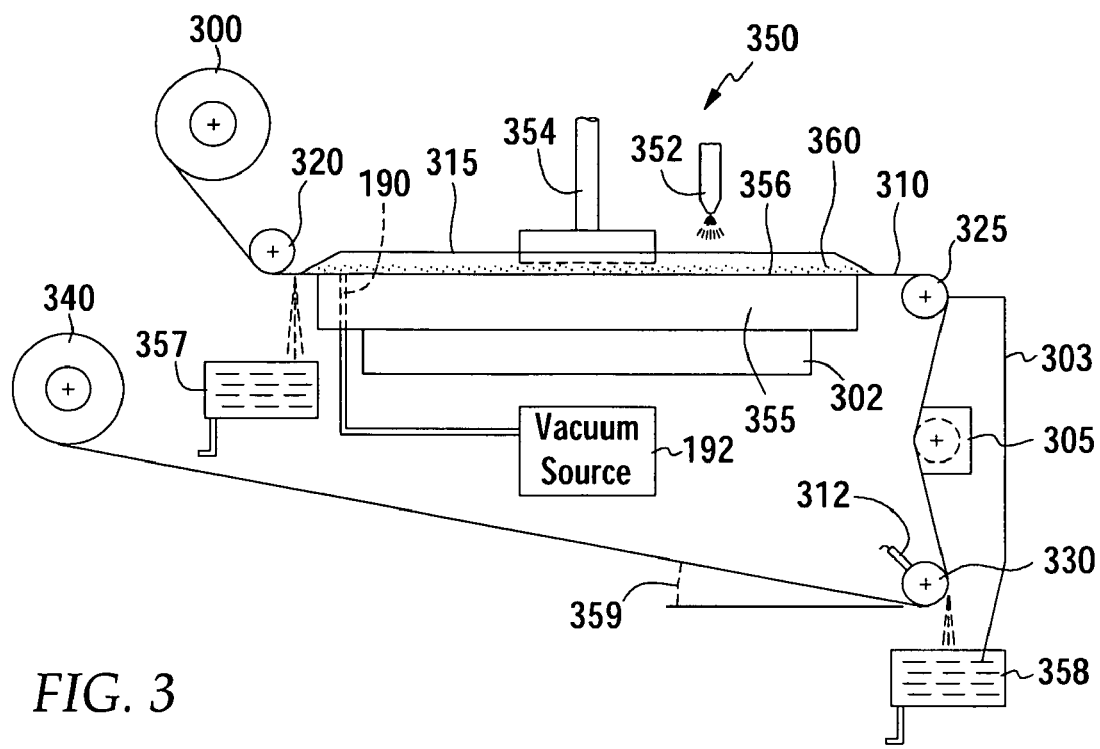
FIG. 3 is a schematic view of a polishing apparatus in which a polishing media magazine is employed.

FIG. 3 shows an embodiment of a polishing apparatus in which it is impractical to adhesively fix a polishing pad to a support base and in which the present invention is all the more important. In this embodiment, a polishing media magazine 350 is employed rather than an individual polishing pad 170. The polishing media magazine 350 is shown with an associated substrate carrier 354 that may be controlled in any of the movements described above with respect to the carrier 180 in FIG. 2. An optional polishing fluid delivery nozzle 352 may supply polishing fluid to the polishing media 310. The polishing fluid delivery nozzle 352 may be attached to and move with substrate carrier 354 or may be separately located or both arrangements may be used. The substrate carrier is shown for illustration purposes only, and may be substituted by other arrangements such as a substrate carrier driven by linear motors for example.

The polishing media magazine 350 preferably uses a polishing media 310 that is supplied in the form of a long media roll. The polishing media 310 preferably comprises a thin polymeric film substrate having either a polishing pad or a fixed abrasive covering over at least a portion of the width thereof. The film may be on the order of 0.001 to 0.020 inches thick, preferably around 0.005 to 0.007 inches thick. The polishing media 310 should be substantially impermeable to the polishing fluid. Preferably the material is made of Mylar film or polyethylene glycol terephthalate. New polishing media 310 is preferably automatically supplied by the polishing media magazine 350 so that user intervention is not required until the entire roll has been consumed.

The polishing media 310 may take a variety of paths through the polishing media magazine depending on the desired configuration and features desired to be interposed within the polishing media path. The paths are described in detail in copending U.S. application Ser. No. 08/833,278 filed on Apr. 4, 1997 and entitled "Polishing Media Magazine For Improved Polishing", which is hereby incorporated by reference herein in its entirety. In FIG. 3 the media is roll fed from supply roll 300 under a first rolling turnbar 320 and across top surface 356 of platen support 355. Polishing media 310 exits the top surface 356 over a second rolling turnbar 325, passes around conditioning system 305, around third turnbar 330 and finally onto take-up roll 340. The third rolling turnbar 330 is preferably located at a vertical elevation which is lower that the take-up roll 340. With this configuration, the resulting angle 359 tends to concentrate the polishing fluid at third rolling turnbar 330 for consistent release from the polishing media 310 into waste tank 358 as shown.

A tensioned portion of the polishing media may be positioned accurately with respect to other features of the polishing media magazine by supporting the tensioned portion with precisely placed turnbar elements. These turnbar elements are typically cylindrically ground elongated cylinders or rods supported at each end by bearings. While these rolling turnbars are typically used to reduce overall friction and wear in the system, other non-rotating elements, such as a porous web roll or porous flotation roll, for example, may be employed to yield the desired polishing media path. Such an example provides a totally now-contact method of transporting the media.

Whatever the elements that are used to form the polishing media path, a tensioned portion is still not entirely resistant to the migration and buckling problems, discussed earlier, that can occur during polishing. To further fix the tensioned portion in position during polishing, polishing apparatuses that employ a polishing media magazine may also be employed with a vacuum fixation system according to the present invention. The present system can be applied to those apparatuses regardless of whether they use a slurry or slurry-less type of polishing media.

The vacuum system draws a vacuum between the tensioned portion of the polishing media and the polishing support surface, to increase the force with which the tension portion is held in its position. As a result, the attraction forces between the polishing media and support surface are greater than the frictional forces between the between the substrate and the polishing media, together with any chemical polishing media that might be employed, and no migration or buckling of the polishing media occurs. This type of solution is not solely limited to chemical mechanical polishing, but may be applied to mechanical polishing apparatuses as well. Additionally, the force supplied by the vacuum system may be sufficient to prevent migration or buckling without the need to tension the polishing media.

In the example shown in FIG. 3, a vacuum source 192 is connected to a vacuum port 190 that passes through the support 355. Although not shown, a sealing barrier 195 is positioned around the vacuum port 190, similar to that described with regard to FIG. 2 and lying just inside the perimeter of the tensioned portion of the media 310 the vacuum source is preferably a high volume, low pressure blower (for example, supplied by GAST, FUJI or AMETEC) that generates about 0.2 to 3.0 psi vacuum at the polishing media. A preferred vacuum to be applied is about 1.2 psi. A venturi pump may be used to generate about 3–4 psi vacuum to the media when the media used is thicker than the averages discussed above.

A typical operation of the apparatus in FIG. 3 would involve indexing of the media 310 to position a predetermined portion of the media above the surface 356, tensioning the predetermined portion of the media 310 above the surface 356, and then applying vacuum via the vacuum source 192. Upon forming a seal between the media 310 and the surface 356 via the sealing barrier, the vacuum would then evacuate all air existing between the media 310 and surface 356 at which time the media would become essentially fixed to the surface 356. Polishing operations can next be commenced. The vacuum is preferably maintained until a movement of the media is desired, whether for conditioning or cleaning purposes or to advance to a new portion of the media to be used for polishing.

Figure 4:
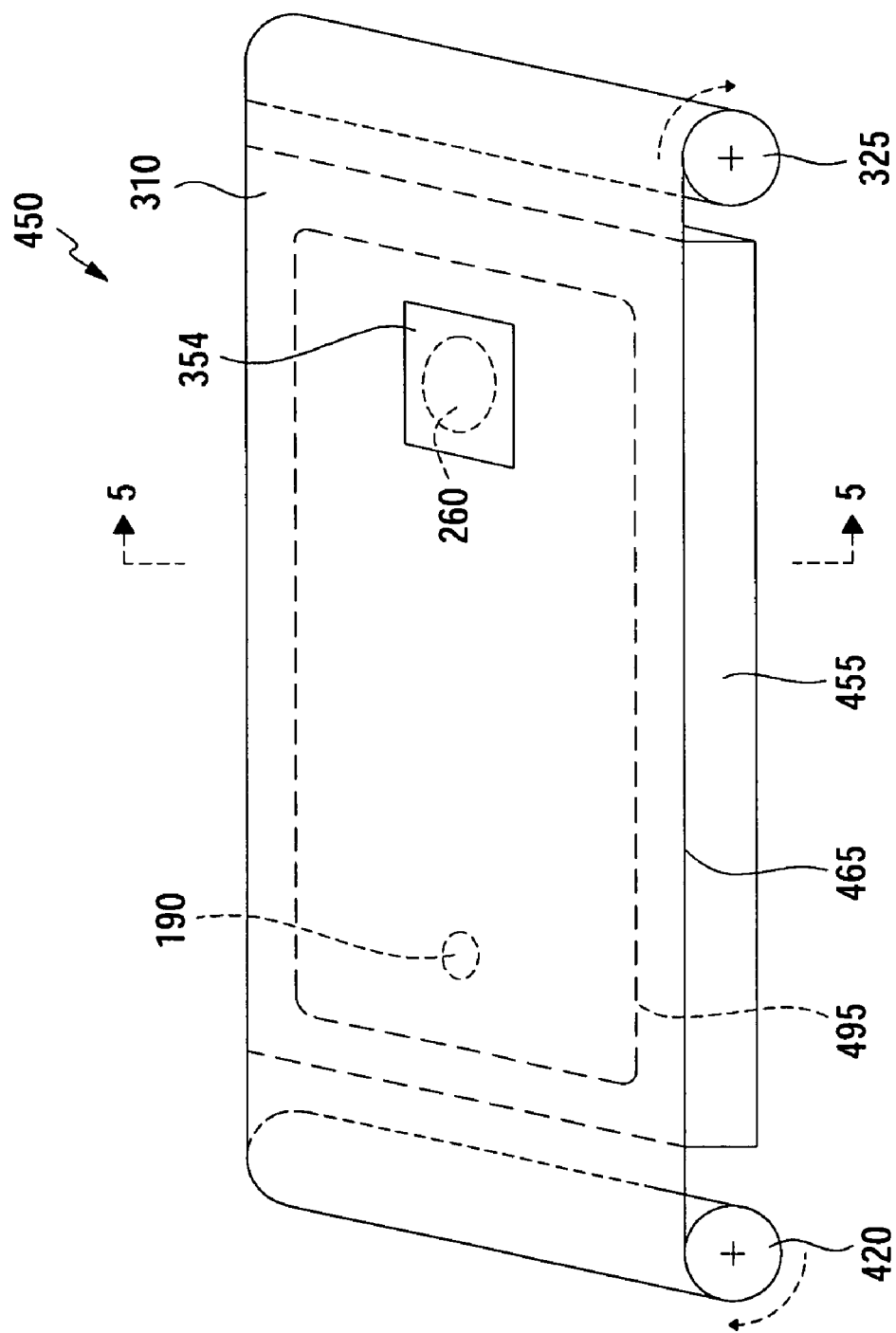
FIG. 4 is a partial isometric view of a polishing system according to another embodiment of the present invention which employs a polishing media magazine.

FIG. 4 is a partial view of a polishing system according to another embodiment of the present invention. The polishing media 310 passes over roller 420, but this is of no consequence to the present invention. In this embodiment the longitudinal edges of the support surface underlying the polishing media 310 are raised in height with respect to the remainder of the support surface by movable edge elements 465. Although not stated above, the longitudinal edges of the surface 356 may optionally be raised with respect to the remainder of the surface 356, however the edges are integral with the remainder of surface 356. The media 310 need only have a working area for polishing as wide as the planar section between the raised edge sections. The area outside of the working width need not be coated, thus saving material expense.

The raised edge portions aid in creating raised edges of the polishing media 310. For embodiments that use a slurry in the polishing process, the raised edges aid in maintaining the slurry in the polishing area and in channeling the slurry to an appropriate receptacle for either recycling or disposal. More important to the present invention, the raised edges also urge the media 310 against the sealing barrier to make sure that a vacuum can be reliably drawn upon application of vacuum to the system through the vacuum source 192.

Figure 5A:
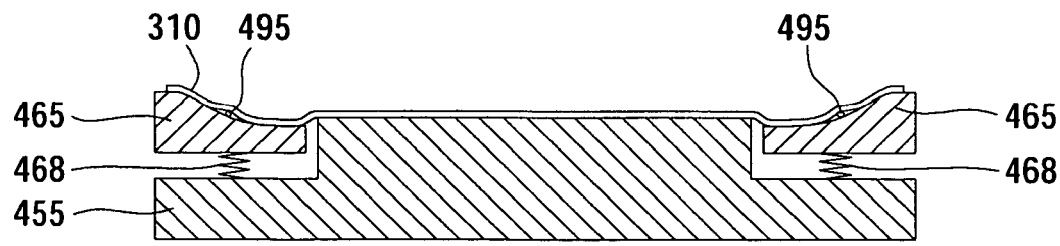
FIG. 5A is a sectional view of the apparatus shown in FIG. 4 and taken along line 5—5 with the vacuum applied.
Figure 5B:
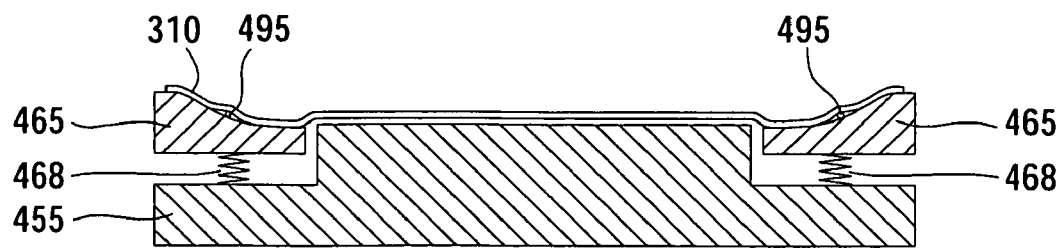
FIG. 5B is a sectional view of the apparatus shown in FIG. 4 and taken along line 5—5 when the vacuum is not applied.

The movable edge elements 465 are particularly effective in maintaining close positioning of the sealing barrier 495 with the polishing media 310 as shown in FIGS. 5A–5B. The edge elements 465 are vertically biased upwardly with respect to the support member 455 by biasing elements 468, as shown in FIG. 5B. The biasing elements 468 are preferably springs, most preferably a type of coil springs, but other springs with equivalent biasing characteristics may be readily substituted, as may other resilient biasing mechanisms such as o-rings, bladders, pneumatic or hydraulic devices, etc.

Upon application of vacuum through the vacuum port 190, a seal is formed between the media 310 and sealing barrier 495. The media is then drawn flat against the support surface 465 and secured there by the vacuum pressure as shown in FIG. 5A. Note that the vacuum force is enough to overcome the biasing force of the biasing elements 468, which are compressed and the edge elements 465 are depressed into their lowermost vertical position as they bottom out when the biasing elements 468 become fully depressed, as shown in FIG. 5A. In their lowermost positions, the edge elements 465 align the polishing media 310 to ensure a smooth and flat interface over the entirety of the planar polishing surface 465 that the edge elements 465 border.

Upon release of the vacuum, the biasing force of the biasing elements becomes greater than the minimized downward force of the media 310. As a result, the edge elements 465 are biased into their uppermost positions as shown in FIG. 5B. By assuming the uppermost positions, the edge elements ensure that the sealing barrier along the longitudinal edges remains in contact with the media 310 when the vacuum is lacking, as also shown in FIG. 5B. This greatly improves the reliability of the system in ensuring that a vacuum can be drawn once again at the desired time.

Figure 6:
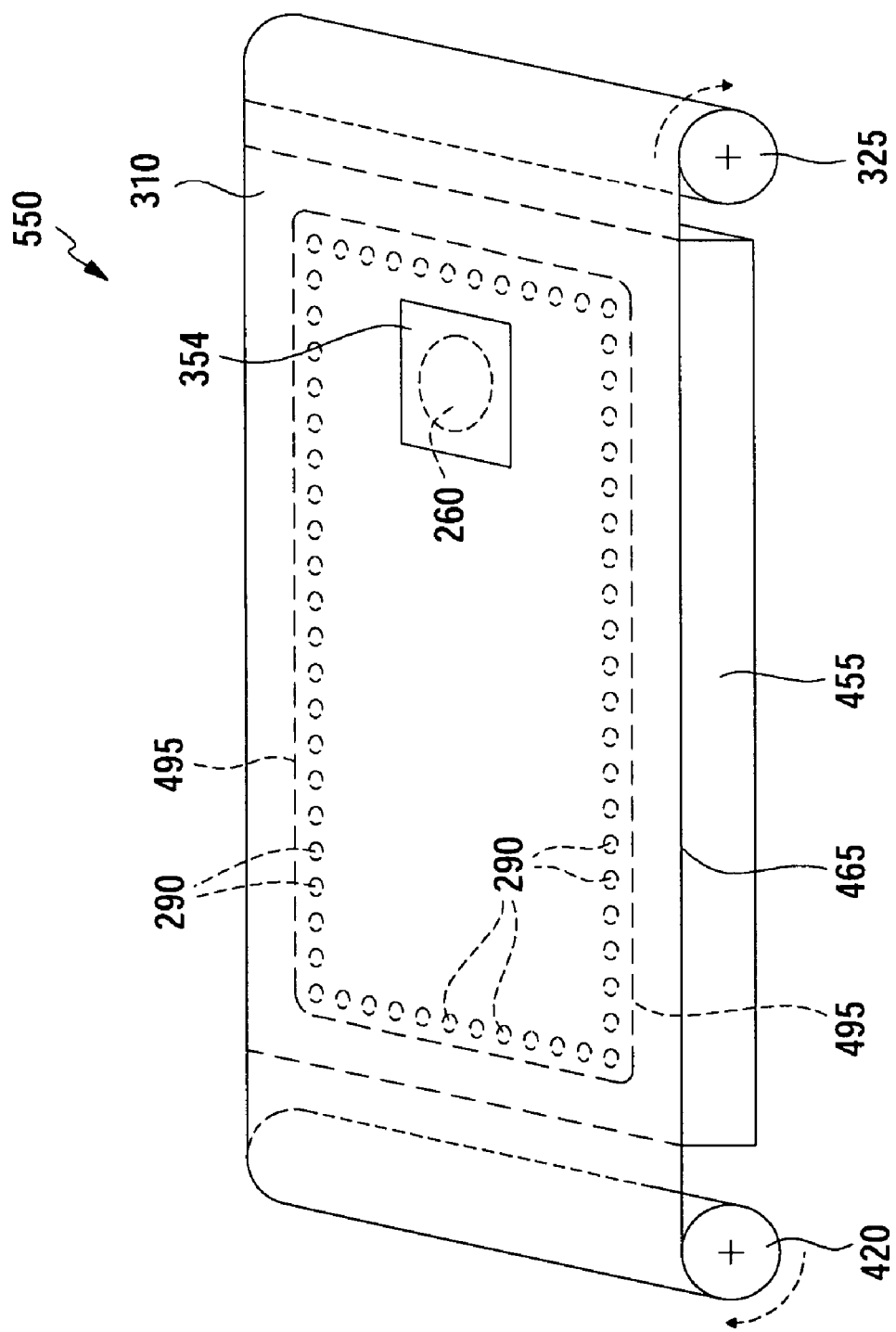
FIG. 6 is a partial view of a variation of the system shown in FIG. 4.

The partial view of a polishing system 550 shown in FIG. 6 shows a variation in the arrangement for applying vacuum to the interface between the support surface 456 of the support member 455 and the polishing media 310. In this arrangement, a plurality of vacuum ports 290 are spaced along the surface 456 just inside the perimeter defined by the sealing barrier 495. In the example shown, the vacuum ports 290 are evenly distributed and are of equal size. However, the invention is not to be so limited. The distribution of vacuum ports may be more concentrated, for example along the width edges to compensate for the lack of elevated edges in these areas. Alternatively, or in addition thereto, the vacuum ports may be of unequal size in different locations to tailor the application of vacuum as preferred. Also, many small vacuum ports could be distributed throughout the surface 456 to accomplish a secondary objective of assisting in the prevention of slurry/liquid starvation, which will be discussed in more detail below.

Figure 7:
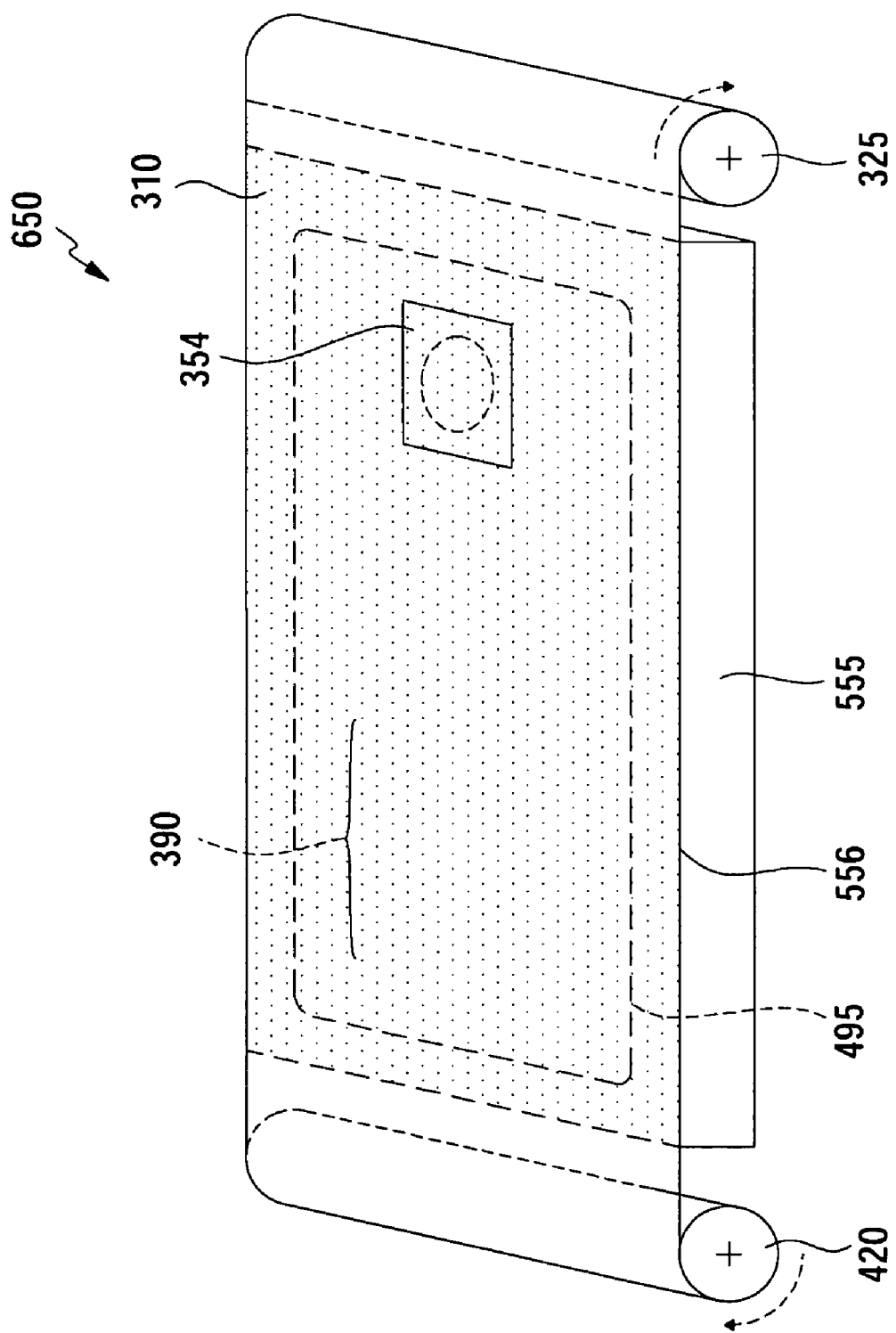
FIG. 7 is a partial view of a polishing system having another variation in the arrangement for applying vacuum to the interface between the support member and the polishing media.

FIG. 7 shows a partial view of a polishing system 650 having another variation in the arrangement for applying vacuum to the interface between the support surface 556 of the support member 555 and the polishing media 310. In this arrangement, a plurality of very small vacuum ports 390 up to a quarter of an inch (0.25"), preferably up to an eighth of an inch (0.125") are distributed over the entire working area (i.e., area underlying the tensioned portion of the polishing media and lying within the boundary of the sealing barrier 495) of the surface 556. In the example shown, the vacuum ports 290 are substantially evenly distributed and are of substantially equal size. However, the invention is not to be so limited. The distribution of vacuum ports may be more concentrated, for example near the perimeter of the surface adjacent the sealing barrier 495. Alternatively, or in addition thereto, the vacuum ports may be of unequal size in different locations to tailor the application of vacuum as preferred. For example, the vacuum ports may be larger along the inside of the perimeter of the sealing barrier 495, as compared to the vacuum ports further inside the sealing barrier (closer to the center of the surface 556).

All of the foregoing embodiments may be constructed so as to have elevated, integral longitudinal edges, movable elevated edge elements, or edges which are coplanar with the remainder of the support surface.

Figure 8:
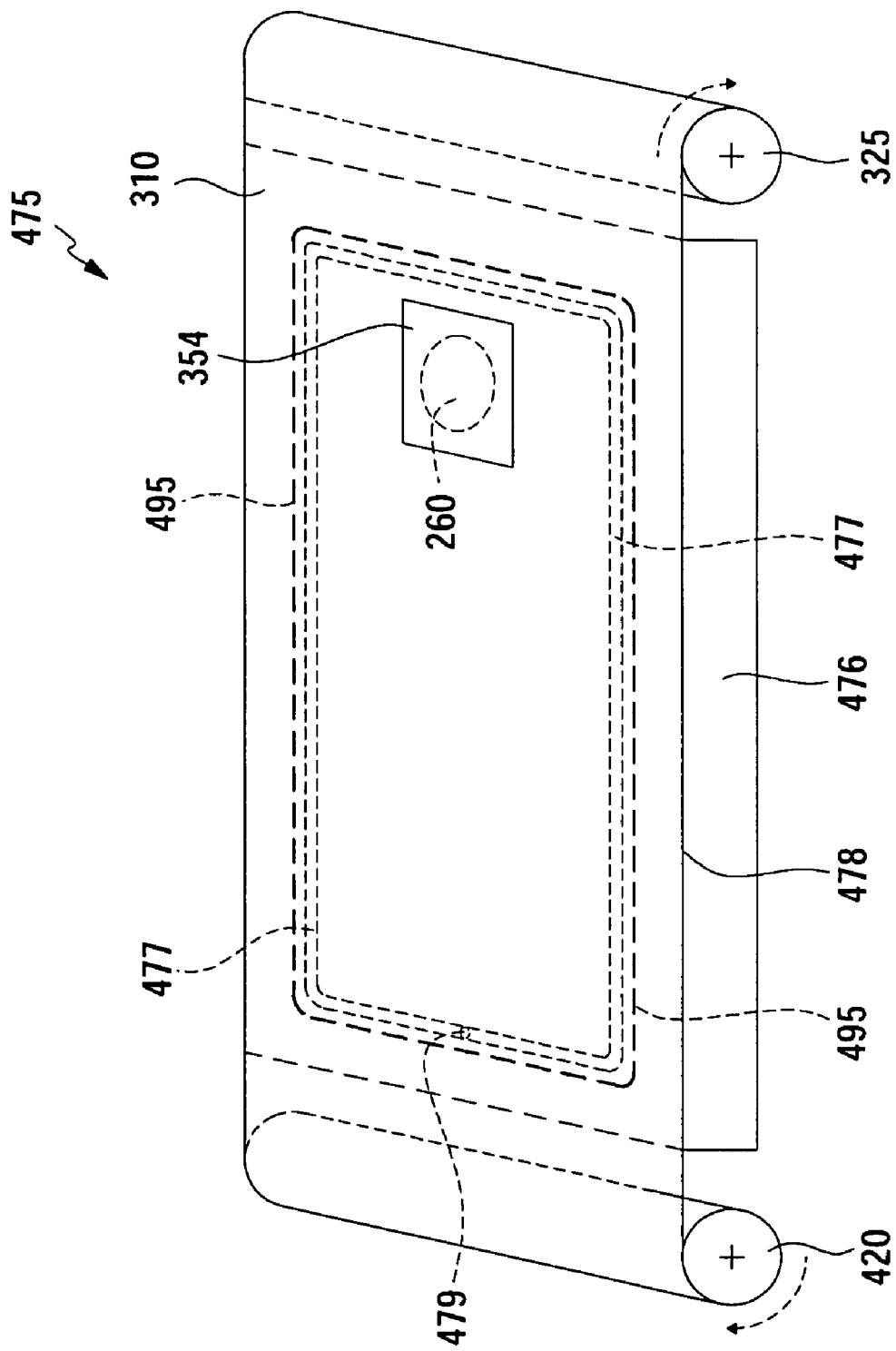
FIG. 8 is a partial view of a polishing system having yet another variation in the arrangement for applying vacuum to the interface between the support member and the polishing media.

FIG. 8 shows a partial view of a polishing system 475 having another variation in the arrangement for applying vacuum to the interface between the support surface 478 of the support member 476 and the polishing media 310. In this arrangement, a groove or channel 477 is formed into the support surface 478 generally around the periphery thereof, but inside the bounds of the sealing barrier 495. A vacuum source (not shown, but like described with regard to FIG. 3) is connected to the channel 477 via a vacuum port 479 that passes through the support 476.

Upon application of the vacuum, existing air, between the polishing media 310 and portion of the polishing surface 478 lying inside the sealing barrier 495, is evacuated through the channel 477 and port 479 so as to draw the polishing media 310 against the polishing surface 478 to securely hold the polishing media in position during the polishing process. In the example shown, the channel 477 is substantially uniformly dimensioned around the entire periphery thereof. However, the invention is not to be so limited, as the channel can be formed to be wider or deeper in select areas such as the corners or ends of the rectangular pattern shown. Also, the channel can be formed in other configurations, such as oval, hourglass, etc.

Figure 9:
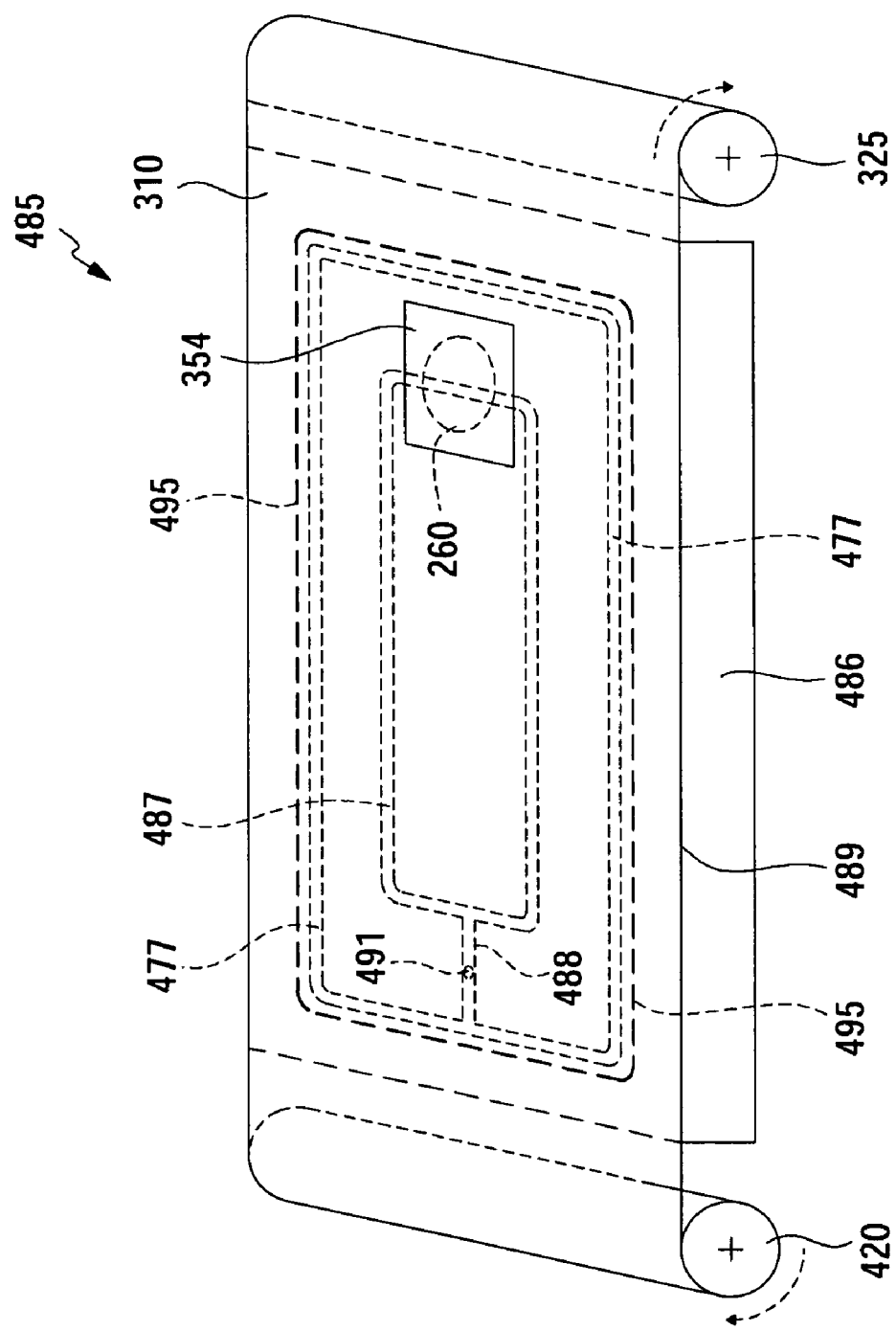
FIG. 9 is a partial view of a polishing system having a variation of FIG. 8, in the arrangement for applying vacuum to the interface between the support member and the polishing media.

FIG. 9 shows another variation that may be practiced using vacuum channels. In this embodiment, an additional channel 487 is formed interiorly of the perimeter established by the channel 477. The two channels 477 and 487 are connected by a connecting port 488 which lies beneath the polishing surface 489. Alternatively, a channel could be formed in the polishing surface 489 to connect the channels 477 and 487, but a port 488 is preferred. Since the channel 487 will generally lie more in the path of polishing, it is preferable, but not necessary, to form the channel 487 to be narrower than channel 477, so as not to significantly disrupt the planarity of the polishing surface. A port 491 connects the channels 477, 487 and port 488 to a vacuum source (not shown).

All of the foregoing embodiments may be constructed so as to have elevated, integral longitudinal edges, movable elevated edge elements, or edges which are coplanar with the remainder of the support surface.

Figure 10:
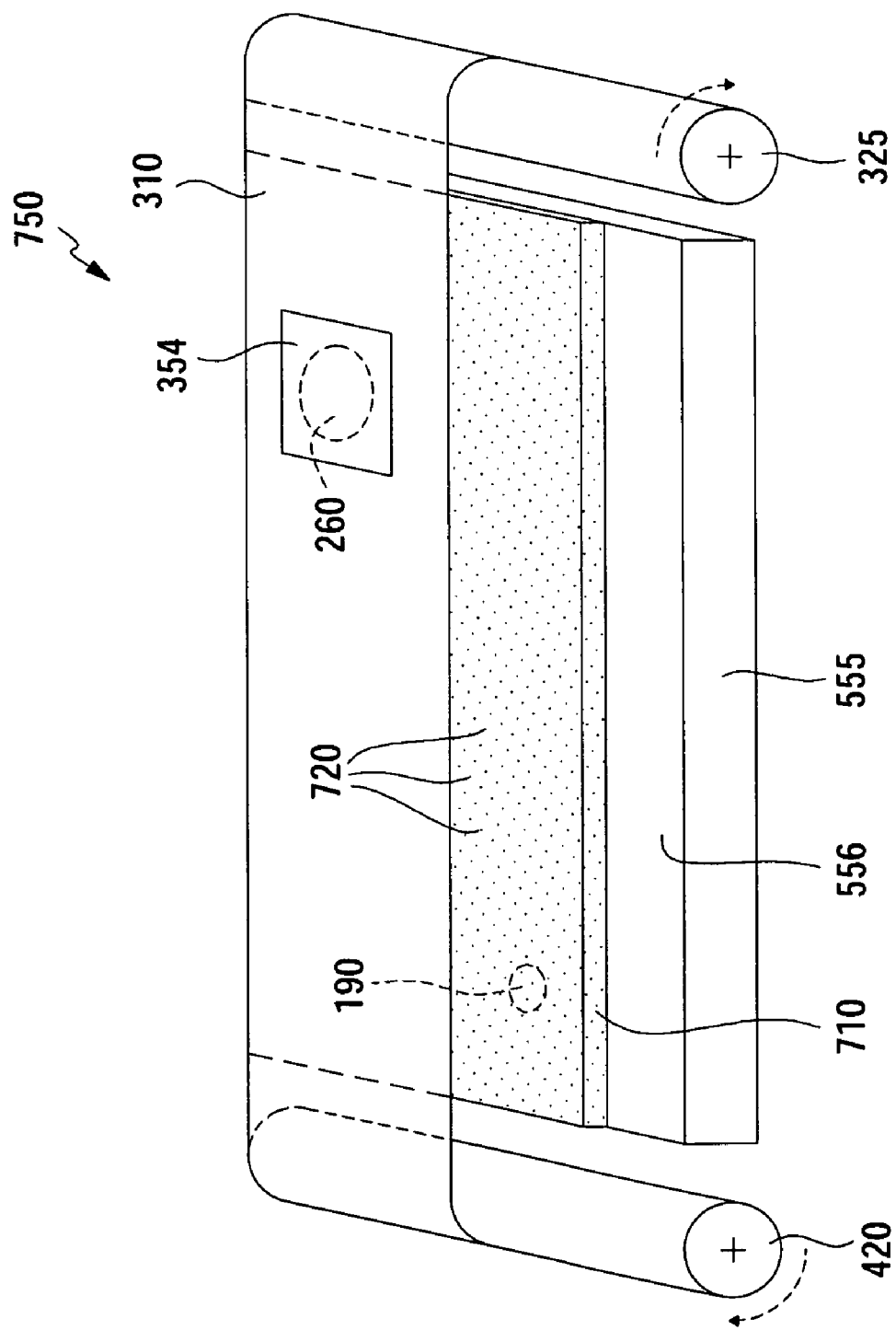
FIG. 10 is a cutaway view of an arrangement of a polishing apparatus which is also adapted toward addressing the problem of depletion of the polishing fluid during polishing.

FIG. 10 is a cutaway view of an arrangement of a polishing apparatus which is also adapted toward addressing the problem of depletion of the chemical fluid or slurry or other fluid which is used between the substrate to be polished and the polishing pad during polishing. As referred to above, after a certain amount of polishing motion has occurred, this fluid tends to become more and more depleted until there is virtually no fluid between the substrate and polishing pad. Because of the relatively smooth and planar surfaces that comprise the polishing pad/platen and the substrate surface being polished, the polishing action tends to "sweep out" the chemical fluid/slurry and a vacuum or suction builds up between the substrate surface being polished and the polishing pad.

Figure 11:
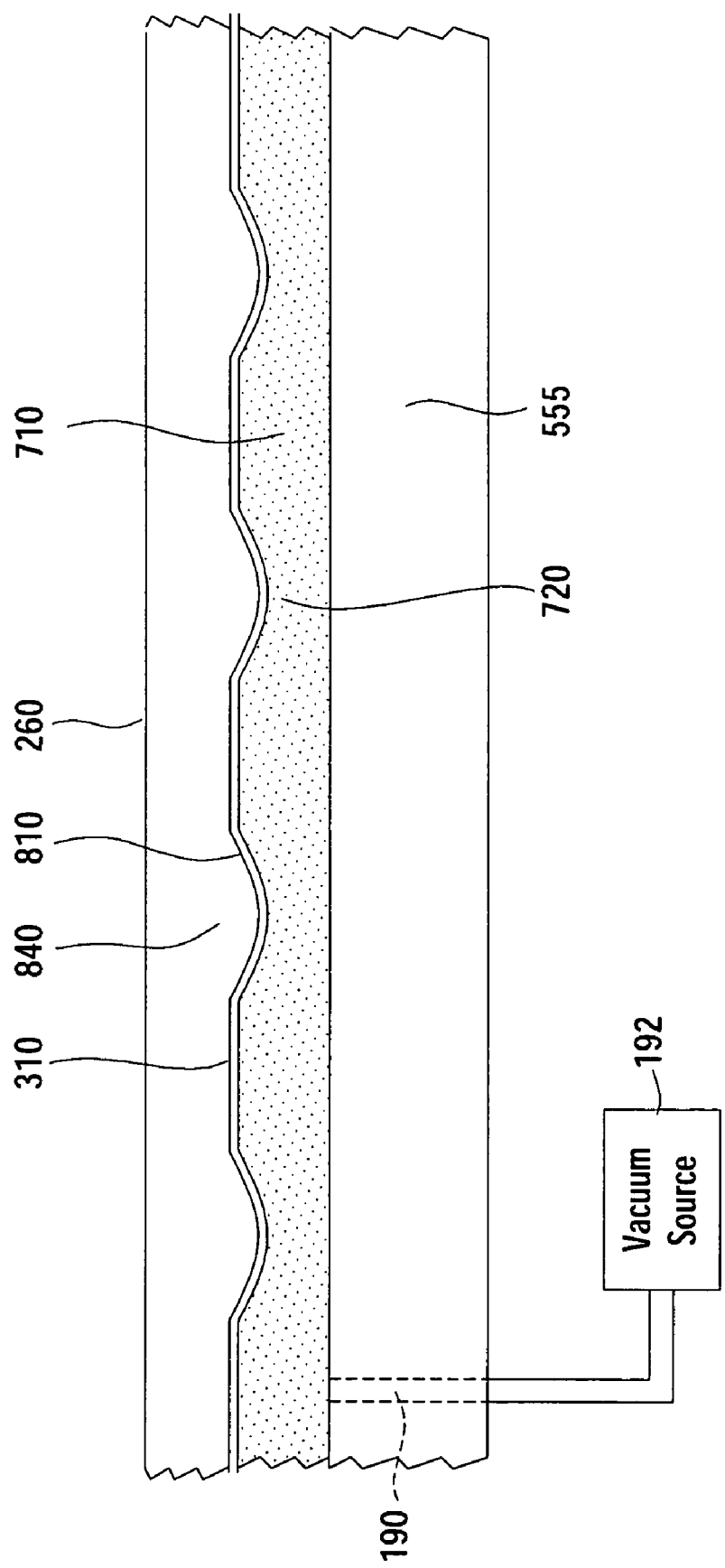
FIG. 11 is a partial sectional view which illustrates the formation of dimples in the polishing surface of the polishing media.

The polishing apparatus 750 includes a porous, resilient layer 710 between the polishing media 310 and the support surface 556. When vacuum is applied via the vacuum port 190, the polishing media 310 is forced toward the support surface 556 with a force sufficient to at least partially compress the resilient layer 710. The thin polishing media is further drawn against the resilient layer 710 and partially into the porosities 720 within the resilient layer 710 as air is depleted from the porosities. The result is that a plurality of concavities or "dimples" are formed in the polishing surface of the polishing media 310. A partial sectional view of the relationship between the support 555, resilient layer 710, polishing media 310 and substrate 260 is diagrammed in FIG. 11.

Concavities 810 in the polishing media 310 are formed over the porosities 720 of the resilient layer 710 when the vacuum is applied as described above the concavities act as capacitances for slurry, KOH, water, or whatever liquid medium 840 is used during the polishing process. Thus, even when a very planar substrate 260 passes over the polishing media 310, not all of the fluid 840 is swept out of the polishing area. Rather, pockets of fluid/polishing medium remain in the dimples 810 to help prevent slipping/sticking (e.g., "stiction") problems that are often observed as a result of slurry/fluid starvation beneath the substrate to be polished.

A preferred resilient layer is the IC1000 pad supplied by RODEL, although other available equivalent porous and resilient materials may be substituted. Alternatively, relatively non-resilient layers having a porosity similar to IC1000 may be successfully used for dimple formation in the polishing media 310. Still further, dimples may be formed in the polishing media 310 if the layer between the polishing media 310 and support surface 555 is left out altogether, when the support surface 556 is provided with vacuum ports 390, similar to those shown in FIG. 7, that are close to the pore size of IC1000.

Figure 12:
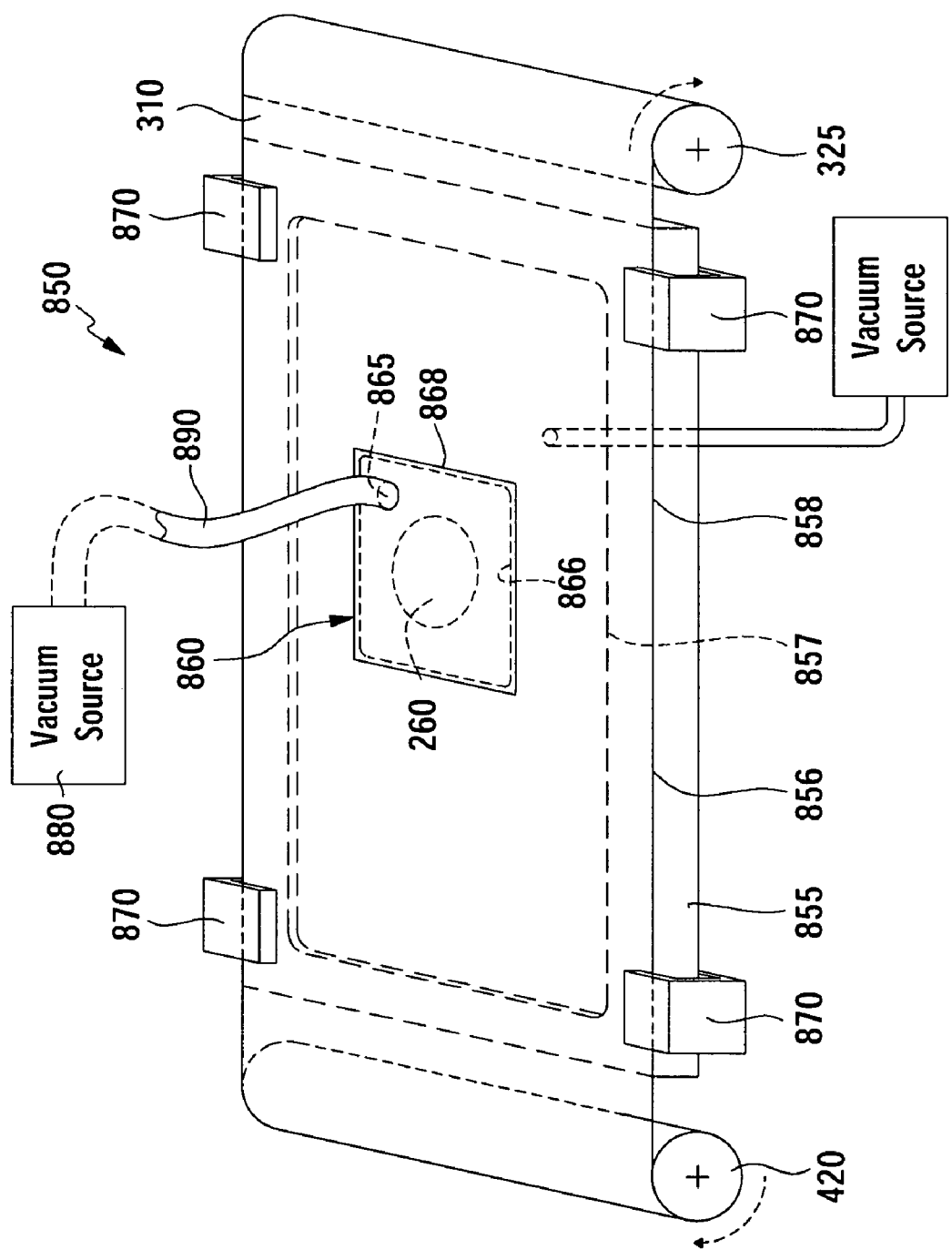
FIG. 12 is a partial perspective view of a polishing system according to another embodiment of the present invention.
Figure 13:
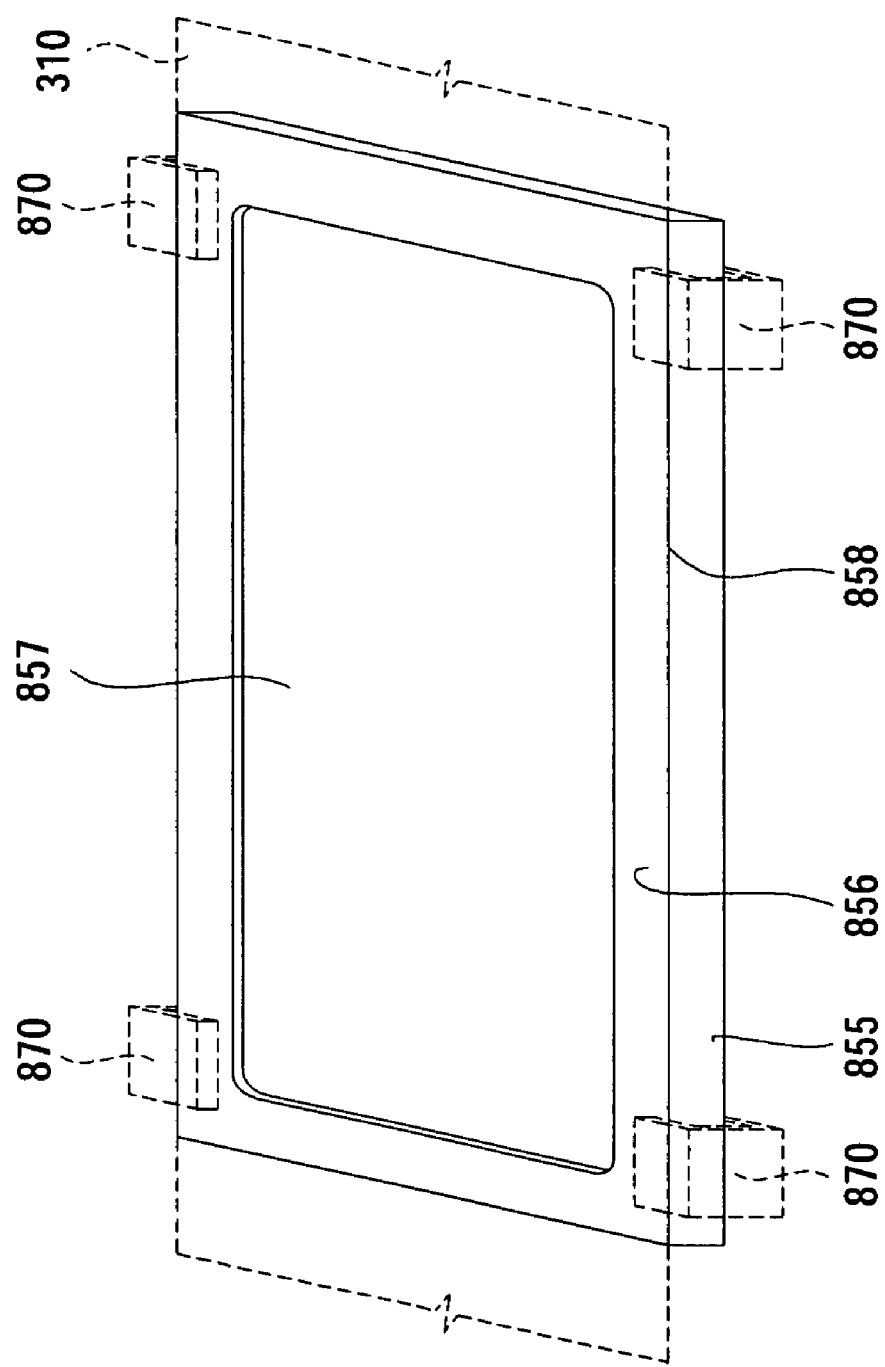
FIG. 13 is a view of the support member used in the embodiment of FIG. 12.

FIG. 12 is a partial view of a polishing system according to another embodiment of the present invention. The polishing media 310 passes over rollers 420 and 325 as in previous embodiments, but, as in the previous embodiments, this is of no consequence to the present invention, as the present invention may be practiced with other media arrangements, e.g., a single flexible sheet of polishing media. In this embodiment the support surface 856 of the support member 855 is hollowed out or at least recessed in the central portion 857 thereof (see also FIG. 13).

The edge surfaces 858 support the polishing media 310 and the polishing media is preferably tensioned over the surface 855 and clamped to the edge surfaces 858 by clamps 870 with or without the application of vacuum to the periphery of the polishing media, preferably with. The media is preferably tensioned to at least 2 lbf per inch of media width. Preferably the clamping is performed near the four corners of the table using four clamps 870 as shown, but more or fewer clamps may be used. Alternatively, the media may be clamped along the entire edge thereof along both side using long clamps the surfaces of which are extended by an underlying foam or other soft tapering substance.

The substrate carrier 860 is provided with at least one vacuum port 865 preferably in an area surrounded by the containment ring 868 or other structure outlying the substrate 260. The vacuum port 865 is connected to a vacuum source 880 via a vacuum tube 890. As in the previous embodiments, this embodiment is not limited to the use of a single vacuum port, but alternative arrangements may include multiple vacuum ports of equal or unequal size, variously spaced around the perimeter of the ring area. Preferably, when a multitude of vacuum ports are employed, the vacuum ports are equally spaced about the ring area, but this is also not absolutely necessary.

At least one sealing barrier 866 is provided around the perimeter of the substrate carrier 860, preferably very close to the edge of the carrier 860 and necessarily surrounding the vacuum port(s) 865. Preferably, the surface of the containment ring 868 that contacts the polishing media 310 functions as the sealing barrier 866. Optionally, a dedicated sealing barrier may be positioned either on the containment ring contacting surface, or adjacent the inside circumference of the containment ring 868. Upon application of vacuum through the vacuum port 865, a seal is formed between the media 310 and sealing barrier 866. The media is then drawn flat against the substrate 260 and bottom surface of the substrate carrier 860 and secured there by the vacuum pressure drawn through vacuum port 865.

Polishing of the substrate may next be commenced. Pressure applied by the substrate carrier 860 against the substrate 260 works against the vacuum force that draws the media 310 against the surface of the substrate 260 to be polished, thereby providing the working pressure needed to polish the substrate (i.e., the "P" variable in Preston's equation). One advantage of this arrangement is that an absolutely flat, planar polishing or support surface is not required. Additionally, a much lighter weight support member 855 is possible due to the recessed or hollow central portion that does not need to be capable of providing a support against which the polishing will take place.

Upon release of the vacuum, the biasing force of the tensioned media 310 becomes greater than any attractive forces that might possibly remain between the media 310 and the substrate 260 and carrier 860. As a result, the media 310 withdraws from contact with the substrate 260 and substrate carrier 860 and resumes a substantially planar configuration which is substantially coplanar with support 855. An optional feature may be provided on carrier 860 to provide a positive force such as positive fluid pressure (preferably air) against the media 310 after release of vacuum pressure to assist in separating the media 310 from the substrate 260 and carrier 860.

The carrier 860 is then elevated from the media 310 to enable easy removal of the substrate 260 for inspection and/or replacement. Once a substrate is repositioned between the media 310 and carrier 860, the carrier 860 is repositioned near or against the media 310. Reapplication of vacuum produces a seal as described above, at which time polishing is recommenced.

Figure 14:
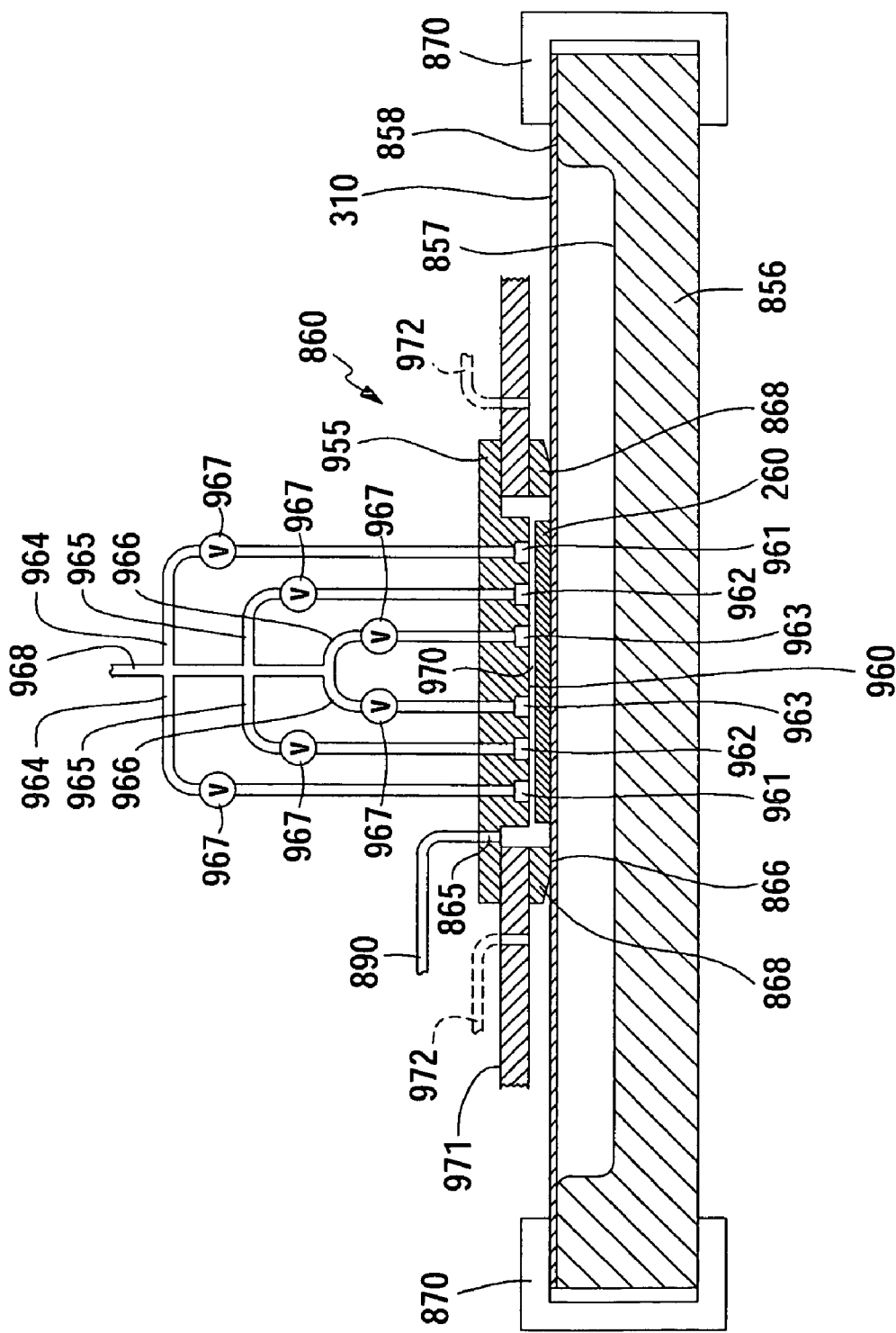
FIG. 14 is a sectional view of an apparatus employing the principles of the system shown in FIG. 12.

FIG. 14 is a sectional view of a system using the vacuum techniques described above with respect to FIGS. 12 and 13. Also shown is an embodiment of a substrate carrier 860. The plate 955 of the substrate carrier 860 forms an upper reference plane from which the force application means 960 apply the load to the substrate 260. In this example, the force application means include three concentric rings 961, 962 and 963 which are configured to emit controlled flows of gas and/or liquid. Preferably, the application means 961, 962 and 963 emit air to form a pressurized air layer 970 between the plate 955 and the substrate 260. However, other gases, water, a mixture of water and air and/or other gases, or vacuum may also be employed in forming a bearing or fixation layer 970 between plate 955 and substrate 260. Of course, this type of carrier is not limited to the use of three rings, but may use four rings or more, or even one or two rings.

In the embodiment shown, pressure lines 964, 965 and 966 connect the rings 961, 962 and 963, respectively to a source of pressurized air (not shown). Throttle valves 967 are provided on each of the lines to enable an operator to independently regulate the flow through each of the rings 961, 962 and 963 while using a single pressure input line 968. A more detailed and complete description of such a carrier is set forth in a co-pending application entitled "Padless Substrate Carrier" filed on even date herewith and bearing Attorney's Docket No. 36172-20017.00. The aforementioned "Padless Substrate Carrier" application is hereby incorporated by reference thereto in its entirety.

Optionally, slurry lines 972 may pass through the drive plate 971, to allow continuous or otherwise automatically controlled feeding of slurry for systems employing a slurry with the polishing media. The present invention is not limited to use with the carrier described in FIG. 14, but may be used with more conventional carriers, including those that employ a substrate backing pad, and those that rotate. Other designs, such as those with bladder-filled, conformable crowns and other pressure arrangements for conforming the crown of a carrier, may also be used.

In the embodiment of FIG. 14, flow through the rings 961, 962 and 963 may be set to deliver an equal flow rate/pressure of air/liquid, or a constant pressure profile or both may coincide. Additionally, the outermost ring 961 can be formed very close to the edge of the faceplate 955 to enable the pressure wave to extend at a substantially constant value nearly to the edge of the faceplate. The bearing layer 970 further enables the substrate to "float" or precess with respect to the faceplate 955, since the faceplate 955 does not contact the backside of the substrate once the layer 970 has been formed. The radius of the substrate 260 is somewhat smaller than that of the faceplate, and the substrate is maintained in position between the faceplate 955 and the polishing media 310 by the presence of containment ring 868.

The combination of the ability to apply substantially uniform load pressure over the entire surface of the backside of the substrate with the ability to allow the substrate to precess or float within the confines of the containment ring results in a very uniform polishing process that removes material consistently from the edge of the substrate to the center.

Alternatively, in situations where shaping or conformation of the pressure profile is required, the flow through the rings 961, 962 and 963 can be varied to achieve the desired conformation of the pressure profile.

During polishing with the arrangement of FIG. 14, in addition to the application of force by applicators 960 by the carrier as described above, the vacuum applied through 890 to the polishing media and within the carrier 860, draws the polishing media 310 against the substrate 260, and is held in position there by the force of atmospheric pressure $P_a$ pressing against the polishing media 310 on the back side thereof with uniform pressure, while the back surface of the substrate 260 is supported by fluid/air pressure supplied by the carrier 860, or by vacuuming the substrate to the carrier through a full porous sheet, for example.

Advantageously, this arrangement requires no vertical force application of the carrier 860 against the support 856. Thus, the drive plate 971 only needs to provide horizontal force during polishing. Nor is a precision polishing surface required, since the actual polishing action is accomplished out of contact with the support 856, with the polishing media 310 being pressed against the polishing surface of the substrate 260. This greatly reduces the required weight of the polish processing machine as well as reducing the cost of the support 856. Additionally, since the support 856 may be made much less bulky and less heavy, this enable multiple units or modules to be stacked much more easily, for parallel processing of substrates. Such modules may be stacked or oriented with the polishing surface of the wafer in a horizontal configuration facing up, in a horizontal configuration facing down, or in a vertical or other "off-horizontal" configuration.

Another optional feature of the carrier 860 is the provision of a faceplate 955 which is formed out of a transparent material, such as polycarbonate with an electrostatic film on the surface thereof, for example. The provision of a transparent faceplate 955 allows an observer to confirm that the substrate is properly precessing during polishing.

Figure 15:
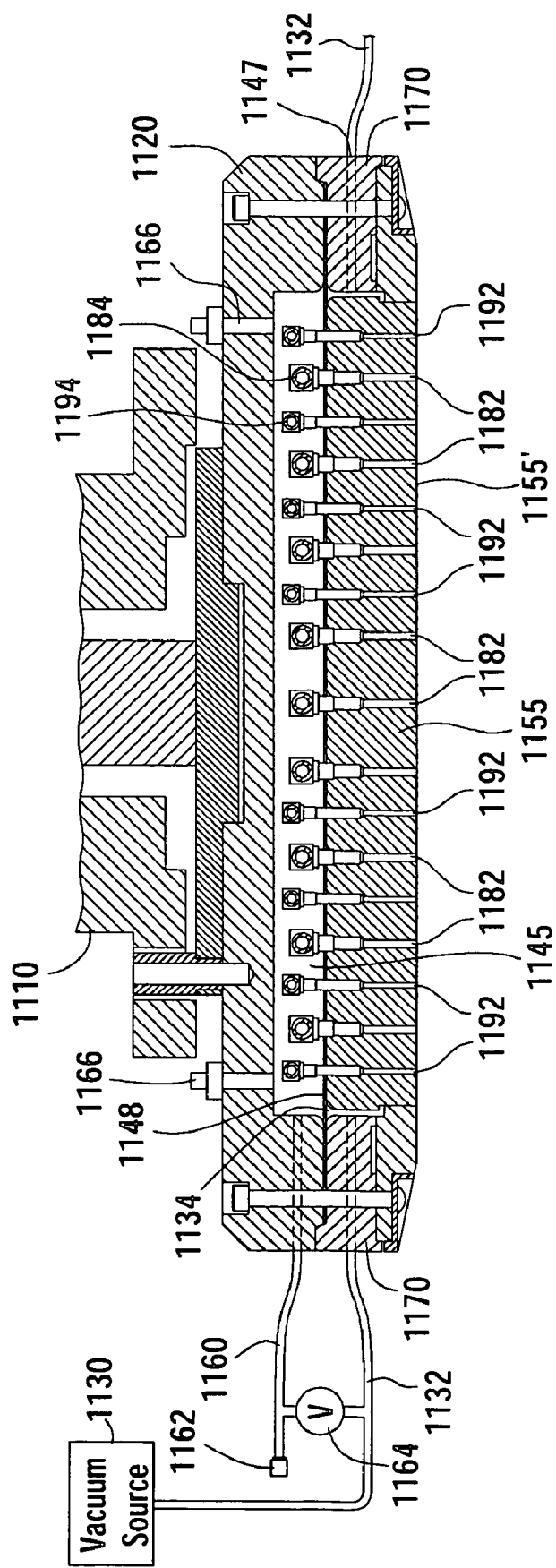
FIG. 15 is a sectional view of another embodiment of a substrate carrier for use in employing the principles of the system shown in FIG. 12.

FIG. 15 is a sectional view of another preferred embodiment of a substrate carrier 1060 which uses vacuum both for control of the substrate extension by the carrier plate, as well as to supply a fixation force for holding the substrate against the carrier. In this arrangement, the carrier plate 1155 is mounted to a carrier loading column 1110, via seal plate 1120 and carrier plate down stop 1172 extending from containment ring support 1170. A diaphragm 1140 is mounted between the seal plate 1120 and the carrier plate 1155 to form a pressurizable chamber 1145.

The location of the carrier loading column 1110 forms the basis for gross positioning of the carrier. The location of the carrier loading column 1110 provides the primary load control of the containment ring 1180 which provides side load bearing control of the substrate during polishing.

A vacuum source 1130 is connected to a second pressurizable chamber 1134 via main vacuum lines 1132, which are connected to vacuum holes 1147 in the containment ring support 1170. Vacuum wafer pick up holes 1182 in the carrier plate 1155 are connected to an independently controllable vacuum/pressure source (not shown) via manifold 1184 which is joined to at least one vacuum port 1166 by vacuum tubing and fixtures (not shown). The application of vacuum through vacuum holes 1182 fixes the back side of a substrate against the carrier plate 1155. In this example, four rings of vacuum holes are provided in addition to a vacuum hole centrally located through the face 1155' of carrier plate 1155, although other configurations of vacuum holes could be alternatively used. Additionally, monitoring holes 1192 may be provided intermediate the vacuum hole 1182 arrangements to be used for monitoring the pressure and/or flow at the locations of their placement. The monitoring holes may be independently connected to individual monitoring pressure/flow sensors (not shown) or may be connected to a central sensing unit (not shown) though manifold 1194.

A differential vacuum line 1160 connects with pressurizable chamber 1145 and an orifice 1162 is provided at an opposite end of vacuum line 1160 which is exposed to atmospheric pressure. A valve 1164, preferably a bleed valve, interconnects the main vacuum line 1132 and the differential vacuum line 1160. The valve 1164 may be adjusted so as to close off the differential vacuum line 1160 to the vacuum source 1130, in which case the pressurizable chamber 1145 will assume atmospheric pressure via the orifice 1162. This relatively high pressure expands the pressurizable chamber to drive the diaphragm 1148 and thus the carrier plate 1155 and face 1155' downward in FIG. 15, which effectively provides a greater polishing force on the substrate. Carrier plate down stop 1172 prevents overextension of the carrier face 1155' in the downward direction by limiting the downward movement of the carrier plate 1155.

The valve 1164 may be adjusted so as to open the differential vacuum line 1160 to the vacuum source 1130 and to variably adjust the amount of flow, in which case the pressurizable chamber 1145 will assume pressure values less than atmospheric pressure. This contracts the pressurizable chamber to draw the diaphragm 1148 and thus the carrier plate 1155 upward in FIG. 15, which effectively provides a lesser polishing force on the substrate. The degree of upward movement is controllable by varying the flow through adjustments of the valve 1164 as referred to above.

During polishing with this arrangement, similar to the arrangement of FIG. 14, vacuum is also applied to the polishing media to draw the polishing media 310 against the substrate 260, and the polishing media is held in position by the force of atmospheric pressure $P_a$ pressing against the polishing media 310 on the back side thereof with uniform pressure, while the back surface of the substrate 260 is held by the vacuum applied through the carrier faceplate 1155', as described above.

Similar advantages to those discussed with regard to the embodiment in FIG. 14 also exist with regard to this embodiment. In order to control the generation of heat that ensues from the abrasion of the substrate and the frictional forces between the substrate and the polishing media, misters or air sprayers may be used to apply one or more flows of cooling streams against the backside of the polishing media 310, i.e., the side which does not directly contact the substrate. Alternatively, a water bed may be provided in contact with the backside of the polishing media 310.

It may also be desirable to provide a more rigid backing on the polishing media 310 by vacuuming a thin polycarbonate sheet (e.g., about 0.060 inches thick) to the backside of the media. Alternatively, stiffness could be increased by simply increasing the thickness of the polishing media itself. Additionally or alternatively, the backing sheet may be slit with grooves on the side which contacts the back side of the polishing media to enhance uniformity and planarization of the substrate.

EXAMPLES

1. A polishing support surface is provided with a substantially rectangular sealing barrier having dimensions of about 22"×19". A single vacuum port is provided centrally and at one end of the polishing surface defined within the perimeter of the sealing barrier. By applying a vacuum pressure of about 2 psig, the approximately 418 in$^2$ provides approximately 836 pounds of attractive force to a polishing media that overlies the support surface and which makes a vacuum seal with the sealing barrier. This extra load eliminates stretch, migration and buckling of the polishing media, and may be used to eliminate the need for tensioning of the polishing media. The polishing media is a MYLAR™ film having a fixed abrasive on the polishing area thereof, and is supplied by 3M Company or DuPont.

In addition to the same conditions as in (1) above, an IC1000 layer is positioned as a subpad beneath the polishing media and above the support surface. When the vacuum is applied through the vacuum port, the polishing area of the polishing media is drawn down against the subpad and the support surface. Air is depleted from the spaces between the polishing media, subpad and support surface, causing a compression of the subpad and also causing the portions of the polishing media overlying the pores of the subpad to be partially drawn into the pores. As a mixture of KOH and water is supplied to the polishing surface of the polishing media, the polishing operation is commenced. Movement of the wafer carrier, wafer retaining ring and the wafer against the polishing media tends to sweep out the KOH/water polishing solution from the polishing area.

However, dimples in the polishing media, which were formed by the portions of the polishing media overlying the pores of the subpad being partially drawn into the pores of the subpad by the vacuum, trap small pools of the KOH/water polishing fluid thereby making the polishing fluid continuously available to the wafer surface being polished.

What is claimed is:

1. An apparatus for stabilizing a polishing surface comprising:
    a substantially planar inflexible support base;
    a flexible, advanceable polishing pad overlying the support base;
    a resilient pad interposed between the polishing pad and the support base, the resilient pad being at least one of perforated and porous;
    one or more vacuum ports disposed in the support base and underlying the polishing pad, wherein application of vacuum through the one or more vacuum ports pulls the polishing pad against the support base to maintain the polishing pad in a predetermined polishing position; and
    a seal forming a perimeter around the one or more vacuum ports on the support base, wherein an airtight seal is formed between the support base and the polishing pad along the seal upon the application of vacuum.

2. The apparatus of claim 1, wherein the seal assembly further comprises a sealing barrier, a movable edge element, and a biasing element.

3. The apparatus of claim 1, wherein the one or more vacuum ports lie around a perimeter of the support base.

4. The apparatus of claim 1, wherein the one or more vacuum ports are substantially equally distributed over the support base.

5. The apparatus of claim 1, wherein the one or more vacuum ports includes a group of relatively larger vacuum ports around a perimeter of the support base and a group of relatively smaller vacuum ports substantially equally distributed over an area of the support base within the perimeter.

6. The apparatus of claim 1, wherein the perforated pad comprises perforations having a diameter less than about 0.25 inches.

7. The apparatus of claim 1, wherein the support base further comprises a first groove formed therein, the first groove coupled to the vacuum port.

8. The apparatus of claim 7, wherein the support base further comprises a second groove formed therein.

9. The apparatus of claim 8, wherein the support base further comprises a third groove formed therein, the third groove intersecting the first and the second groove.

10. The polishing apparatus of claim 1, further comprising a substrate carrier movably mounted with respect to the polishing pad and the support base.

11. A polishing apparatus comprising:
    a flexible polishing pad adapted to contact a front surface of a substrate to be polished;
    a substrate carrier adapted to support a back surface of the substrate;
    at least one vacuum port adapted to apply vacuum against the flexible polishing pad; and a sealing ring contacting the flexible polishing pad and forming a perimeter around the one or more vacuum ports.

12. The apparatus of claim 11, further comprising at least one port in a face of the substrate carrier for establishing a fluid bearing between the substrate carrier and the substrate.

13. The apparatus of claim 12, wherein the at least one port in the face is adapted to establish an air bearing between the face and the substrate.

14. The apparatus of claim 11, further comprising at least one port in a face of the substrate carrier for establishing fixation between the substrate carrier and the substrate.

15. The apparatus of claim 14, wherein at least one port in the face is adapted to draw a vacuum between the substrate carrier and the substrate.

16. The apparatus of claim 15, further comprising a vacuum source connected to the at least one port in the face.

17. An apparatus for stabilizing a polishing media comprising:
   a substantially planar inflexible support base having a top surface;
   a sealing ring disposed on the top surface of the support base;
   an advanceable polishing media disposed over the top surface of the support base and contacting the sealing ring;
   a means for drawing the polishing media against the support surface; and
   at least two rolling turnbar elements wherein a tensioned portion forms straight-line tangent segments between the turnbar elements.

18. The apparatus of claim 17, further comprising:
   a polishing media supply roll and a polishing media take-up roll, wherein the tensioned portion extends from the supply roll to the take-up roll.

19. The apparatus of claim 17, wherein a portion of the tensioned portion passes around a conditioning system.

20. The apparatus of claim 19, wherein another portion of the tensioned portion passes around a third rolling turnbar element, the third turnbar positioned vertically lower than the take-up roll forming an angle adapted for consistent release of the polishing media into a waste tank.

* * * * *

UNITED STATES PATENT AND TRADEMARK OFFICE
CERTIFICATE OF CORRECTION

PATENT NO. : 7,381,116 B2 Page 1 of 1
APPLICATION NO. : 11/394255
DATED : June 3, 2008
INVENTOR(S) : Sommer et al.

It is certified that error appears in the above-identified patent and that said Letters Patent is hereby corrected as shown below:

In the Best Mode for Carrying Out the Invention:

Column 14, Line 19, please delete "1060".

Signed and Sealed this

Eighteenth Day of November, 2008

JON W. DUDAS
*Director of the United States Patent and Trademark Office*